United States Patent
Yuan et al.

(10) Patent No.: US 7,361,985 B2
(45) Date of Patent: Apr. 22, 2008

(54) THERMALLY ENHANCED MOLDED PACKAGE FOR SEMICONDUCTORS

(75) Inventors: Yuan Yuan, Austin, TX (US); Bennett Joiner, Austin, TX (US); Chuchung (Stephen) Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 185 days.

(21) Appl. No.: 10/974,658

(22) Filed: Oct. 27, 2004

(65) Prior Publication Data

US 2006/0087015 A1    Apr. 27, 2006

(51) Int. Cl.
*H01L 23/34*    (2006.01)
(52) U.S. Cl. ................. 257/713; 257/E23.083
(58) Field of Classification Search ........... 257/712, 257/713
See application file for complete search history.

(56) References Cited

U.S. PATENT DOCUMENTS

| | | | | |
|---|---|---|---|---|
| 3,896,544 A | * | 7/1975 | Fosnough | 438/117 |
| 3,996,447 A | * | 12/1976 | Bouffard et al. | 219/541 |
| 4,093,971 A | * | 6/1978 | Chu et al. | 361/702 |
| 4,415,025 A | | 11/1983 | Horvath | |
| 4,442,450 A | * | 4/1984 | Lipschutz et al. | 257/713 |
| 4,479,140 A | * | 10/1984 | Horvath | 257/713 |
| 4,689,720 A | * | 8/1987 | Daszkowski | 361/704 |
| 4,993,482 A | * | 2/1991 | Dolbear et al. | 165/80.2 |
| 5,107,330 A | * | 4/1992 | Dahringer | 257/718 |
| 5,159,531 A | * | 10/1992 | Horvath et al. | 361/704 |
| 5,287,001 A | * | 2/1994 | Buchmann et al. | 257/719 |
| 5,376,587 A | * | 12/1994 | Buchmann et al. | 438/122 |
| 5,455,462 A | | 10/1995 | Marrs | 257/796 |
| 5,528,456 A | * | 6/1996 | Takahashi | 361/704 |
| 5,548,090 A | | 8/1996 | Harris | |
| 5,616,957 A | | 4/1997 | Kajihara | 257/712 |
| 5,650,914 A | * | 7/1997 | DiStefano et al. | 361/704 |
| 5,801,330 A | | 9/1998 | Gademann et al. | |
| 5,875,096 A | | 2/1999 | Gates | |
| 5,883,426 A | * | 3/1999 | Tokuno et al. | 257/686 |
| 5,896,269 A | * | 4/1999 | Autry | 361/704 |
| 6,088,228 A | | 7/2000 | Petersen et al. | 361/720 |
| 6,208,517 B1 | * | 3/2001 | Prince et al. | 361/704 |
| 6,297,549 B1 | * | 10/2001 | Hiyoshi | 257/703 |
| 6,462,952 B1 | | 10/2002 | Ubukata et al. | |
| 6,972,485 B2 | * | 12/2005 | Kong et al. | 257/704 |
| 7,019,976 B1 | * | 3/2006 | Ahmad et al. | 361/704 |
| 2004/0036172 A1 | | 2/2004 | Azuma et al. | 257/738 |
| 2005/0180113 A1 | | 8/2005 | Shirakami et al. | |
| 2005/0270744 A1 | * | 12/2005 | Farrow et al. | 361/704 |

FOREIGN PATENT DOCUMENTS

| | | |
|---|---|---|
| EP | 1 347 513 A2 | 9/2003 |
| WO | WO 00/36894 | 6/2000 |

\* cited by examiner

*Primary Examiner*—David A Zarneke
(74) *Attorney, Agent, or Firm*—John A. FortKort; FortKort & Houston P.C.

(57) ABSTRACT

An integrated circuit package (50) is provided which comprises a substrate (20), an integrated circuit (12) mounted on the substrate, and a compressive, thermally conductive interposer (52) mounted on the integrated circuit.

27 Claims, 9 Drawing Sheets

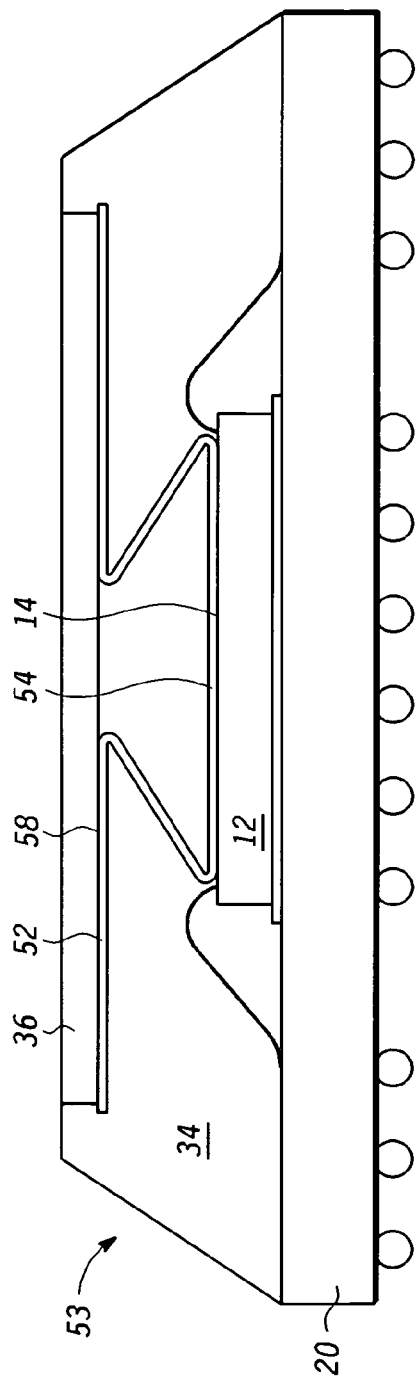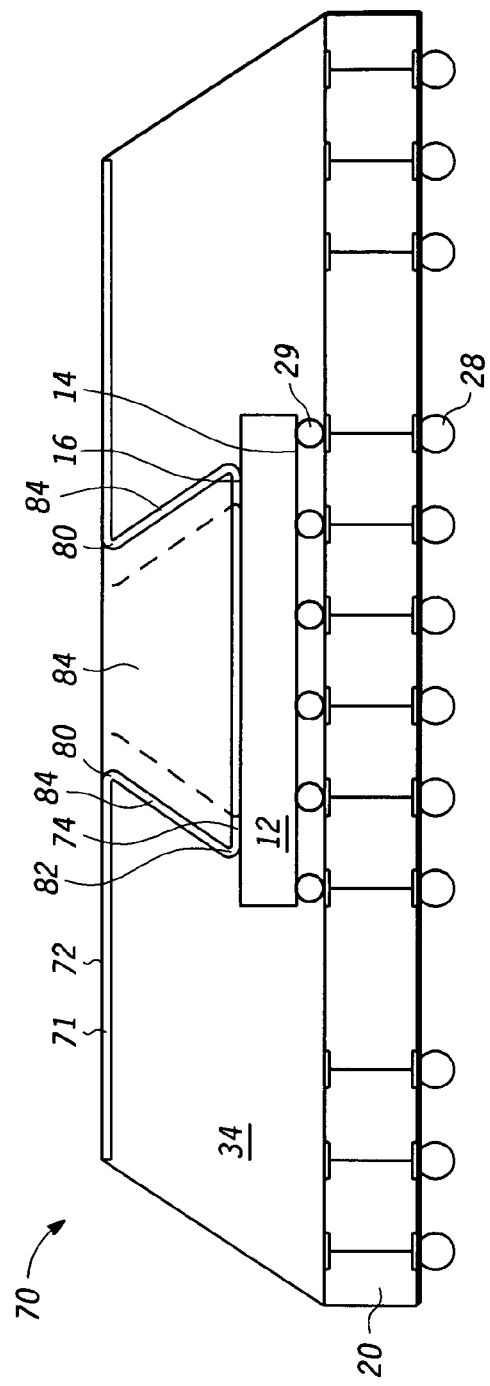

THERMALLY ENHANCED MOLDED PACKAGE FOR SEMICONDUCTORS

FIELD OF THE DISCLOSURE

The present disclosure relates generally to the fabrication of semiconductor devices, and relates more particularly to the packaging of semiconductor devices and to the thermal enhancement of such packaging.

BACKGROUND OF THE DISCLOSURE

Integrated circuits (ICs) generate heat as an undesirable byproduct during their use. This heat byproduct is a significant design consideration, both in the design of the IC and in the design of products incorporating the IC. One strategy for addressing this issue is to design integrated circuits so that they will generate less heat in the first place. Another strategy for addressing this issue is to control how the IC is driven during use. A further strategy is to cool the IC.

Many different tactics have been used to cool ICs. One tactic is to convectively cool the IC by applying moving air over it. This may involve, for example, the use of heat exchangers filled with liquids or gasses to remove heat generated by the IC. Another common tactic to cool ICs has been to attach a heat sink with radiant cooling fins to the IC. In such a device, the cooling fins act to wick away the heat generated by the IC. Frequently, the finned heat sink is combined with a fan, in which case the device radiates off heat or, by acting in conjunction with the fan, convectively transfers heat.

In most implementations of the tactics described above, the ICs have been housed in mechanically designed housings called IC packaging. The packaging provides the dual functionality of physically and electrically insulating the IC, while at the same time providing easy electrical contact to the IC. Since the primary purpose of the packaging is to insulate and protect the IC, the packaging has a tendency to inhibit the release of heat energy.

Prior art tactics employed to address this issue include the incorporation of a heat spreader inside the packaging, or the inclusion of a heat slug which has a surface exposed on the outer surface of the package. FIG. 1 illustrates a cross-section of a prior art surface mounted IC package employing a heat slug. This example is a thermally enhanced plastic ball grid array (TE PBGA) package. The IC package 10 is a housing for an IC 12 with an active surface 14 and a non-active surface 16, and which is affixed via an adhesive layer 18 to a substrate 20. The active surface 14 of the IC 12 is electrically connected via wire 22 to mounting surfaces 24 on the substrate 20. These mounting surfaces 24 contain traces 26 which are typically eventually electrically connected to solder balls 28. Though not shown in FIG. 1, these solder balls 28 are the means by which the packaged IC 10 is surface mounted to provide electrical connection to an electronic circuit board (not shown).

In the IC package shown, the heat slug 30 is non-electrically mounted via mounts 32 on the substrate 20 over the IC 12, and is surrounded by the molding compound 34. The slug is typically manufactured out of copper, aluminum, or steel. In the case of the particular TE PBGA depicted, the slug is approximately 300 μm thick and is made of copper. In some prior art IC packages, the heat slug 30 remains exposed as shown in FIG. 1 so that it can transfer heat more easily out of, and away from, the IC and its packaging. Other prior art IC packages employ a heat spreader fully encased in the molding compound. The heat slug configuration provides marginal beneficial effects. However, the benefits of heat slugs 30 configured in this way have limited efficiency and effectiveness, and are problematic to manufacture.

Part of the reason for its limited effectiveness is that the heat slug is too far from the IC 12 heat source. The packages illustrated in FIG. 1 are typically rated to handle two to three watts (2 W-3 W). Additionally, the space between slug 30 and IC 12 is typically filled with molding compound 34. Because of its low thermal conductivity, the molding compound acts to thermally insulate the IC 12. This fact may be appreciated from TABLE 1 below, which compares the thermal conductivity of a typical molding compound such as G760 with the thermal conductivities of some other materials typically present in the device.

TABLE 1

| Material | Thermal Conductivity (W/mK) |
| --- | --- |
| Silicon | 148.0 |
| Copper | 386.0 |
| Aluminum | 222.0 |
| 37-63 Solder | 50.7 |
| molding compound | 0.7~0.9 |

The lack of proximity between the slug 30 and the IC, and the thermally insulating properties of the molding compound, limit the efficiency of removing heat from the IC 12. While it may be possible to move the slug 30 closer to the IC, this creates design issues because, in such a position, the slug can interfere with the wire leads 22 to the IC 12 and the substrate circuit 26, and complicates the formation of the molding compound 34 around the IC 12 and the slug 30.

Another limitation of some prior art heat slugs is that they require the use of mounts 32 to maintain distance between the slug 30 and the IC 12. The use of mounts 32 is undesirable in that they require landing areas (not shown) on the substrate which must be accommodated when designing the substrate circuits 26.

FIG. 2 is an illustration of another prior art IC package 40. In this package, an interposer layer 42 rests between the IC 12 and the heat slug 44. Typically, in such a package, a conductive adhesive layer 46 is disposed between IC 12 and interposer layer 42, and a conductive adhesive layer 48 is disposed between the interposer layer 42 and the heat slug 44.

Although the package in FIG. 2 has better thermal properties, it is difficult to manufacture. In particular, if the accumulated vertical dimensions are on the larger side of acceptable tolerances, when the device is clamped in the mold tool, the IC may be crushed or damaged. If the dimensions are adjusted to avoid crushing of the die, the mold compound will tend to extend over the top of the spreader, thus leading to poor thermal performance. Hence, the tolerance accumulated from the thicknesses of the components and adhesive layers will cause the manufacturing process to vary between damage due to crushing and poor thermal performance or molding placement.

There is thus a need in the art for removing heat from an IC that is more efficient and/or easier to manufacture, and is therefore more effective. These and other needs are met by the devices and methodologies described herein. Based on a preliminary analysis, it is believed that the improvements to IC packaging described below may produce a doubling of the wattage capacity of the packaging.

BRIEF DESCRIPTION OF THE DRAWINGS

The following is a brief description of the drawings and should be considered in conjunction with the preceding and following detailed description:

FIG. 5 is an illustration of an embodiment of an IC package with a Z-shaped, compressive interposer affixed to the active surface of the IC;

FIG. 6 is an illustration of a flip chip package equipped with a four-leaf, Z-shaped compressive interposer;

DETAILED DESCRIPTION

Figure 1:
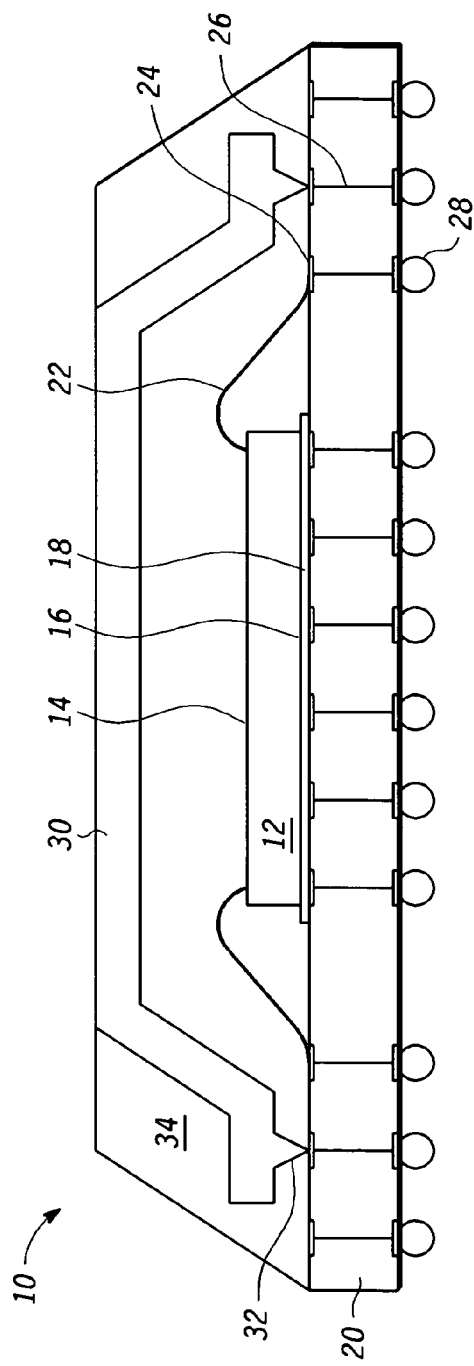
FIG. 1 is an illustration of a prior art IC package with a heat slug.
Figure 2:
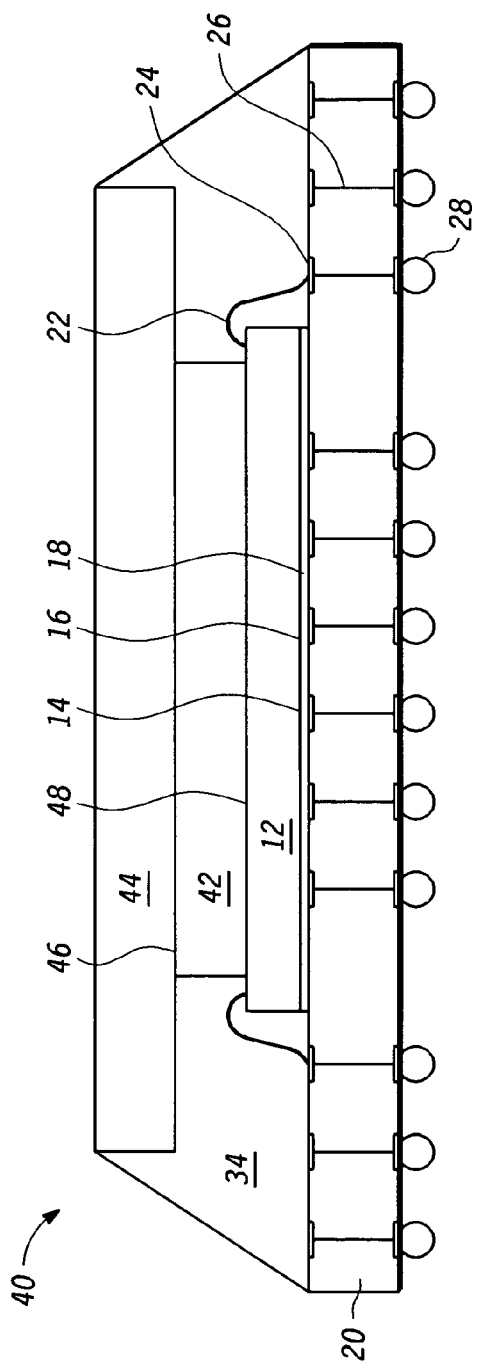
FIG. 2 is an illustration of a prior art IC package with a non-compressive interposer disposed between the IC and the heat slug.
Figure 3:
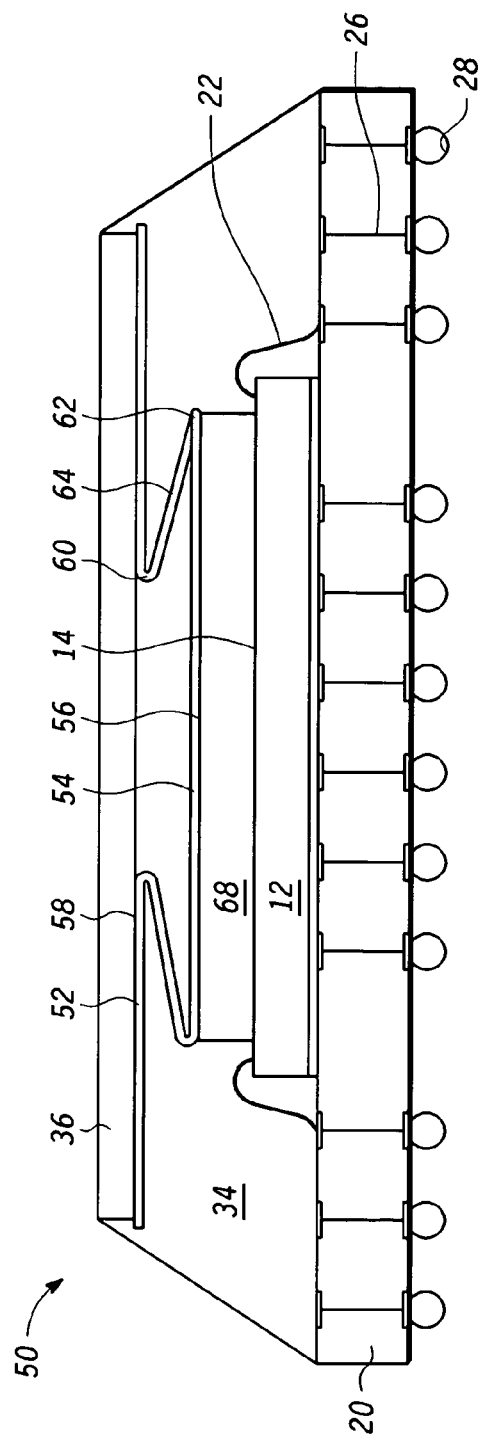
FIG. 3 is an illustration of an embodiment of an IC package with a Z-shaped, compressive interposer disposed between the IC and the heat slug.

FIG. 3 illustrates an IC package 50 with improved heat transmission characteristics. The IC 12 in package 50 is thermally connected to the heat slug 36 by means of a shaped compressive interposer 52. In the embodiment illustrated in FIG. 3, the compressive interposer 52 has a Z-shaped compressive section described in greater detail below.

The core of the IC package 50 is the IC 12. The IC 12 is also the primary source of heat which must be dissipated. Typically, ICs are silicon based structures of complex manufacture with many fine details, and are relatively fragile. This is one of the reasons they must be enclosed in a package. A typical IC at the time of authorship is 50-360 μm thick. It is usually configured in a package with its active surface 14 up, and is affixed to a substrate 20.

The substrate is similar to a circuit board in that it contains circuitry 26 that routes the connections made by means of connectors 22 to surface-mount solder ball 28 locations. The substrate 20 may be rigid. Currently typical rigid substrates range in thickness from approximately 200 μm to a more standard 360 μm or 560 μm. The substrate could also be a film substrate approximately 50 μm to 100 μm thick.

The embodiment illustrated in FIG. 3 employs a non-compressive interposer 68. A typical non-compressive interposer 68 might be approximately 50 μm to 200 μm in thickness and typically comprises a blank silicon die to match the coefficient of expansion of the IC 12. The non-compressive interposer 68 is typically bonded to the IC with a thermally conductive adhesive (not shown) which is also electrically insulating so as to avoid shorting the active side 14 of the IC 12.

In the embodiment illustrated in FIG. 3, the compressive interposer 52 is mounted on top of the non-compressive interposer 68. In such an embodiment, a silver filled adhesive (not shown) can be used because there is no risk of electrical conductance. The use of a silver filled adhesive is also advantageous in that it has higher thermal conductance properties. In the embodiment illustrated, the compressive interposer comprises a shaped 150 μm copper sheet. In other embodiments, other materials and thicknesses and shapes may be used. The choice of materials and material thicknesses depends on a number of factors. Some of these factors include how much heat needs to be transmitted and at what rate, the flexibility of the material, the mechanics of the clamping and molding process, and the configuration of the package. Generally, the overall requirements are that the material is thermally conductive, and that the structure is deformable during the molding process and provides enough surface area on the top and bottom to collect and transmit the heat generated by the IC 12 to an external heat sink (not shown).

The purpose of the heat slug 36 is to act as a heat sink and to provide a thermal connectivity path for other heat transfer devices (not shown) when the IC package is used on circuit boards (not shown) for devices requiring an IC. Many suitable materials may be used as the heat slug including, but not limited to, silicon, aluminum, steel, copper and other heat transmissive materials. It is desirable that the coefficient of thermal expansion of the slug 36 material be closely matched with the coefficient of thermal expansion of its surrounding materials to avoid failure caused by thermal cycling of the package 50.

In this embodiment, the top section 52 of the compressive interposer makes thermal contact with the heat slug 36. While, in some embodiments, a thermally conductive adhesive or paste may be placed between the compressive interposer 52 and the heat slug 36, it is preferred that this material be soft, or at least flexible. The reason for this preference is to allow for variation in the position of the compressive interposer 52 relative to the heat slug 36 during manufacture. The center section 54 of the compressive interposer 52 makes thermal contact with a non-compressive interposer 68. In this interface a thermally conductive adhesive (not shown) may be used. The non-compressive interposer 68, in turn, is thermally mounted on the active surface 14 of the IC 12. Between these layers, a non-electrically conductive, thermally conductive adhesive (not shown) is typically used. This non-compressive interposer layer can be made of any thermally conductive material. However, since it is in close proximity to the active surface of the IC, it is preferred that this material is a non-electrically conductive material such as a blank silicon die. In the embodiment shown in FIG. 3, the non-compressive interposer layer is a blank silicon die designed to provide electrical insulation from the compressive interposer 52. Controlled thermal expansion materials, such as molybdenum, invar-copper-invar or copper-invar-copper structures, may be preferred in some embodiments, depending on cost and need.

During operation, the heat generated by the IC 12 is transmitted from the IC 12 through the non-compressive interposer 68, to the center section 54 of the compressive interposer 68, and up to the top section 52 via a compressive section 64 of the compressive interposer 52. The compressive section 64 of the compressive interposer 52 includes bends 62 and 60 of the compressive interposer 52. The compressive nature of the compressive section 64 is particularly advantageous during manufacture of the package 50. Specifically, the compressive section 64 allows compressive forgiveness while still maintaining thermal contact between the IC 12 and heat slug 36. A secondary advantage of the compressive section 64 is that it is believed that this flexibility will allow for greater tolerance to differences in the coefficient of expansion of adjacent materials during thermal cycling.

A suitable material for the compressive interposer 52 has high thermal conductivity and is flexible in the desired shape. Examples of suitable materials include copper, aluminum and steel and flexible ceramics. The choice of material and thicknesses, and compressive section details with this and other configurations described herein, depend on the needs of a particular package. Although FIG. 3 illustrates a shaped compressively deformable interposer, other types of compressive interposers would also be suitable in other applications. For example, the compressive interposer could be wire mesh or engineered materials with microstructures, such as thermally conductive foams. The salient characteristics of the materials are that they provide good thermal conductance and are compressively deformable during the IC packaging process.

Figure 4:
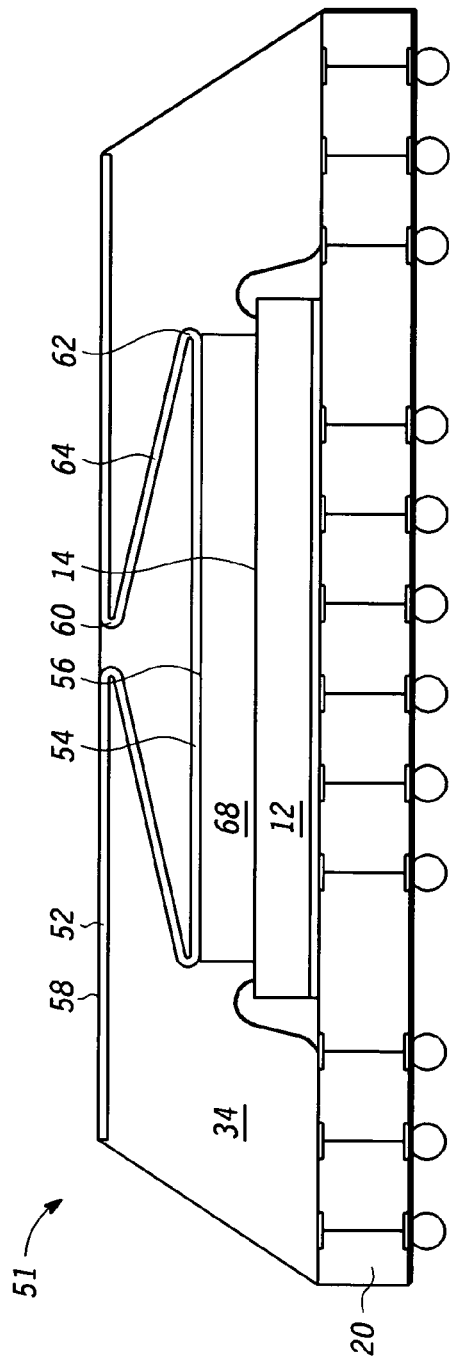
FIG. 4 is an illustration of an embodiment of an IC package with a Z-shaped, compressive interposer without a heat slug.

FIG. 4 is an illustration of an IC package 51 similar to the package in FIG. 3, with the exception that it is lacking the slug/spreader 36 of FIG. 3. In this embodiment, the outer surface 58 of the compressive interposer 52 is exposed to provide direct contact with external heat transfer devices (not shown).

FIG. 5 is an illustration of an IC package 53 similar to the IC package 51 of FIG. 4. The difference in the package illustrated in FIG. 5 is the absence of the non-compressive interposer 68 in FIG. 4. In this embodiment, the center section 54 of the compressive interposer 52 is affixed directly to the active surface 14 of the IC 12 via an electrically non-conductive, thermally conductive adhesive (not shown). In one embodiment, the adhesive takes the form of a thin tape. Thermally conductive adhesives are widely available in many forms, including tape forms and softer paste forms. Both electrically conductive and electrically non-conductive adhesives that suit the purposes described herein are widely available.

FIG. 6 illustrates an IC package 70 with a flipped chip. In this package, the active surface 14 of the IC 12 is down. The IC 12 is electrically attached to the substrate 20 via solder balls 29. It should be noted that the IC package 70 shown in FIG. 6 employs a four-leaf, compressive interposer 71. Three (3) compressive sides 84 can be seen in FIG. 6. This embodiment of a compressive interposer is described in greater detail below.

Figure 7:
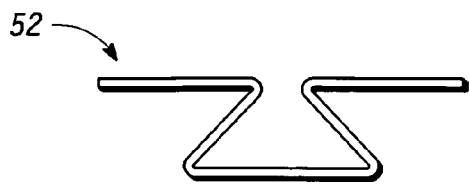
FIG. 7 is an illustration of an embodiment of a Z-shaped compressive interposer.
Figure 8:
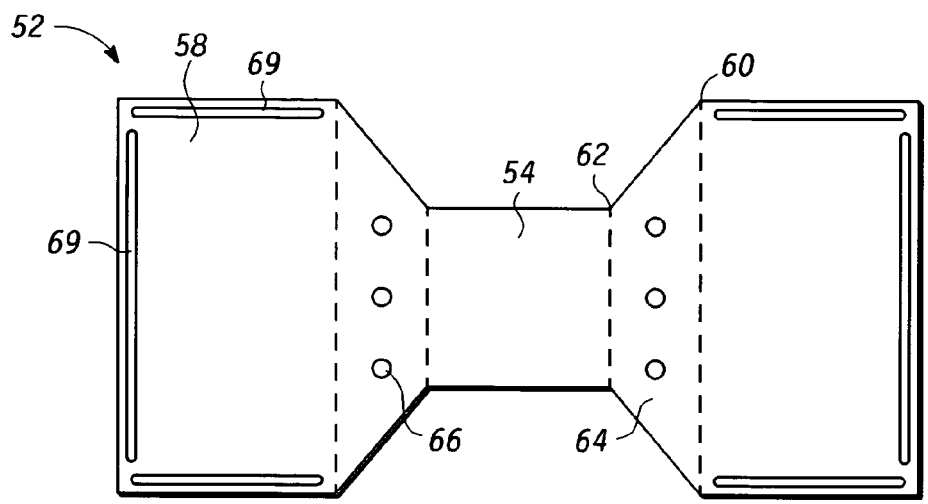
FIG. 8 is an illustration of the embodiment of a Z-shaped compressive interposer which is illustrated in FIG. 7, prior to shaping for assembly.

FIGS. 7-8 illustrate the compressive interposer 52 of FIGS. 3-5 after they are bent into shape. When the compressive interposer is incorporated into a device, the top section 58 will be in thermal contact with the heat slug 36 in FIG. 3 and FIG. 5, and will be exposed to the outside of the package in FIG. 4. The center section 54 will be in thermal contact with the non-compressive interposer 68 in FIGS. 3-4 and with the IC in FIG. 5. Fold lines 60 and 62 create the compressive section 64 which allows for compressive give during the manufacturing process and during thermal cycling.

FIG. 8 also illustrates two additional features that are only shown in this embodiment but may be applied to any other embodiment as well. These include flow holes 66 to allow the flow of molding compound during manufacture, and locking features 69 to help hold the compressive interposer 52 in place during its life.

Figure 9:
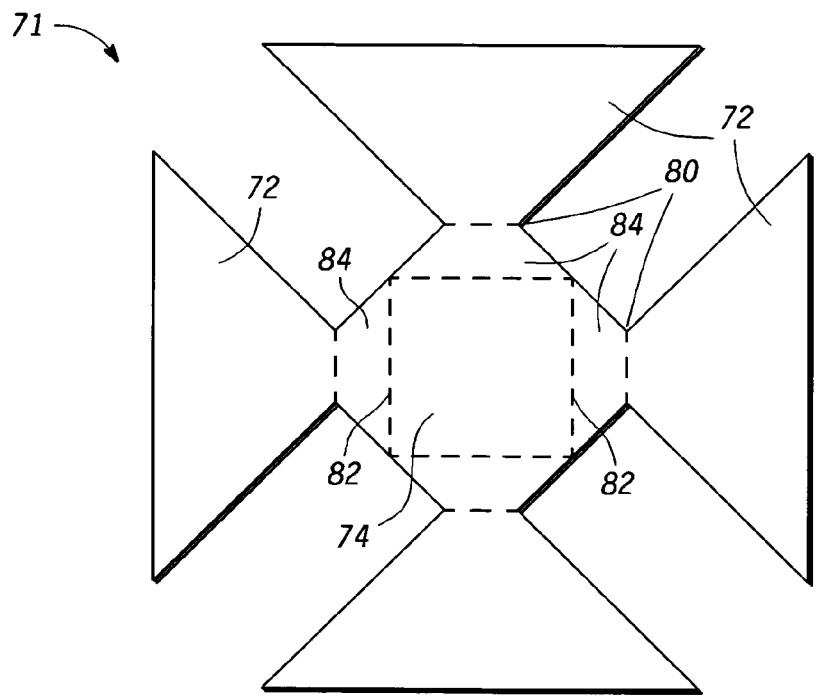
FIG. 9 is an illustration of a four-leaf Z-shaped compressive interposer in a flip chip package, prior to shaping for assembly.
Figure 10:
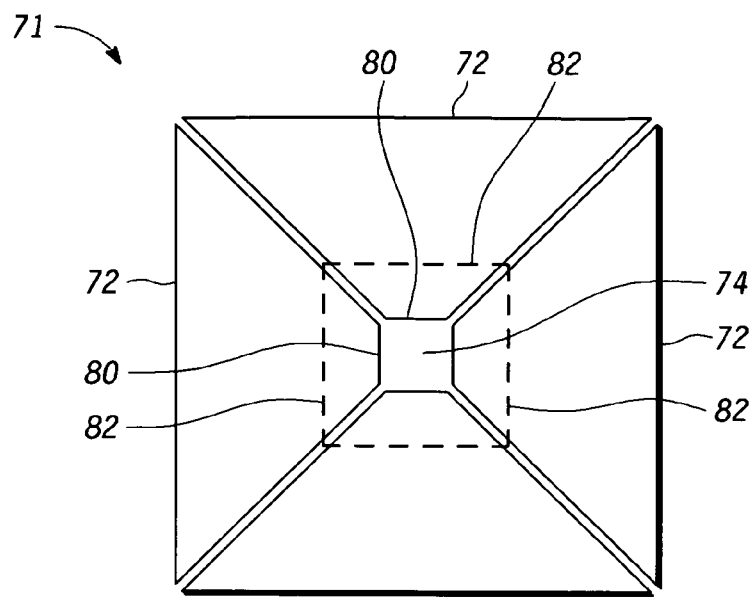
FIG. 10 is an illustration of the compressive interposer in FIG. 9, after folding.

FIGS. 9-10 illustrate another embodiment of a compressive interposer 71. This compressive interposer is similar to the two-leaf interposer 52 in FIGS. 7-8. Though the illustrated interposer is only shown in FIG. 6, it would apply to the other package configurations as well. The center section 74 is affixed to the IC 12 or non-compressive interposer (not shown), depending on the package design. The compressive sections 84 fold up so that the second fold line 80 moves closer to the center of the center section 74 of the compressive interposer 71 along fold lines 82, after which the top sections 72 fold back down along fold lines 80 to a horizontal position in a plane parallel to the plane of the center section 74. These top sections are then either affixed to a heat slug (not shown) exposed to the outside of the package (not shown), or are exposed to the outside of the package (not shown) ready to receive external heat transfer systems (not shown).

Figure 11:
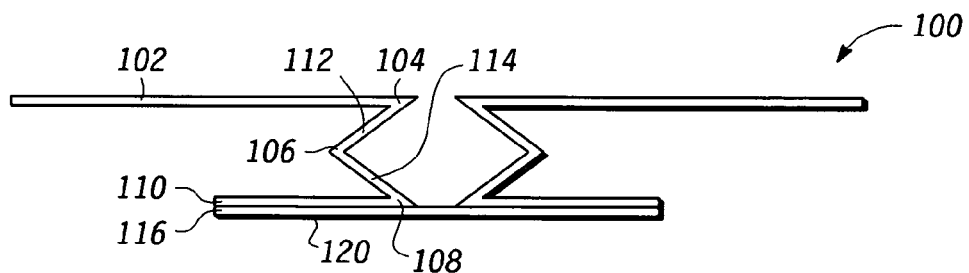
FIG. 11 is an illustration of an embodiment of an accordion-shaped, compressive interposer.

FIG. 11 illustrates an alternative embodiment of the compressive interposer 102. In this embodiment, the compressive section of the compressive interposer 102 is formed by multiple bends 104, 106, 108 and by straight subsections 112 and 114, thereby forming an accordion type configuration. It is believed that this configuration may allow the bottom section 110 of the interposer 102 to remain flat on the IC or non-compressive interposer 116, with the choice depending on the configuration of the rest of the package and on whether a flip chip configuration is desired. For example, in a flip chip configuration, a non-compressive interposer may not be used. On the other hand, if the active surface of the chip is facing upward, it might be desirable for the bottom surface 120 of a non-compressive interposer 116 to be facing the active surface of the IC rather than the compressive interposer, particularly if the compressive interposer is made of an electrically conductive material. FIG. 11 further illustrates the use of two interposers 102.

Figure 12:
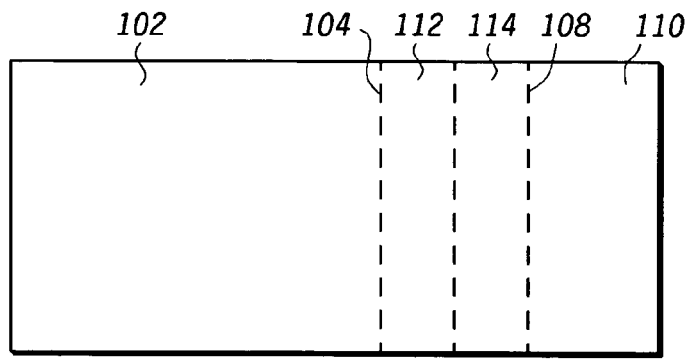
FIG. 12 is an illustration of the embodiment of the accordion-shaped, compressive interposer which is illustrated in FIG. 11, prior to shaping for assembly.

FIG. 12 illustrates one of the compressive interposers 102 of FIG. 11 prior to being folded for assembly. Top section 102 will be exposed or will be positioned so that it is in thermal contact with a heat slug (not shown). Bottom section 110 will be contacting the non-compressive interposer or IC 116. The compressive section will be formed using straight sections 112 and 114 and bend lines for bends 104, 106 and 108.

Figure 13:
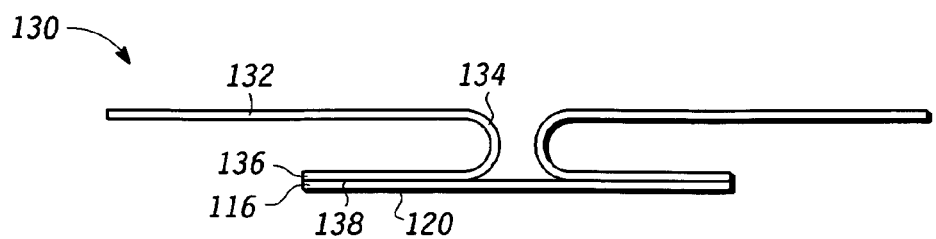
FIG. 13 is an illustration of an embodiment of a C-shaped, compressive interposer.
Figure 14:
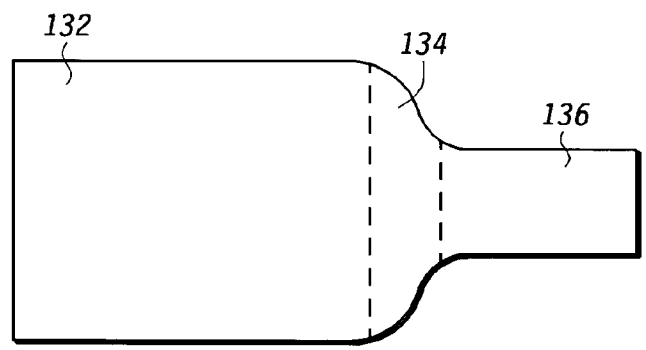
FIG. 14 is an illustration of the embodiment of the C-shaped, compressive interposer which is illustrated in FIG. 13, prior to shaping for assembly.

FIG. 13 illustrates an alternative embodiment of a compressive interposer 132 for the present disclosure. In this embodiment, the compressive section 134 is C-shaped. FIG. 14 illustrates the top section 132 which will be exposed or in thermal contact with a heat slug, and the bottom section 136 which will be in thermal contact with the IC or non-compressive interposer 116 with a bottom IC facing surface 120. FIG. 14 also illustrates the lines that represent the beginning and end of the C-shaped curvature of the compressive section 134.

Figure 15:
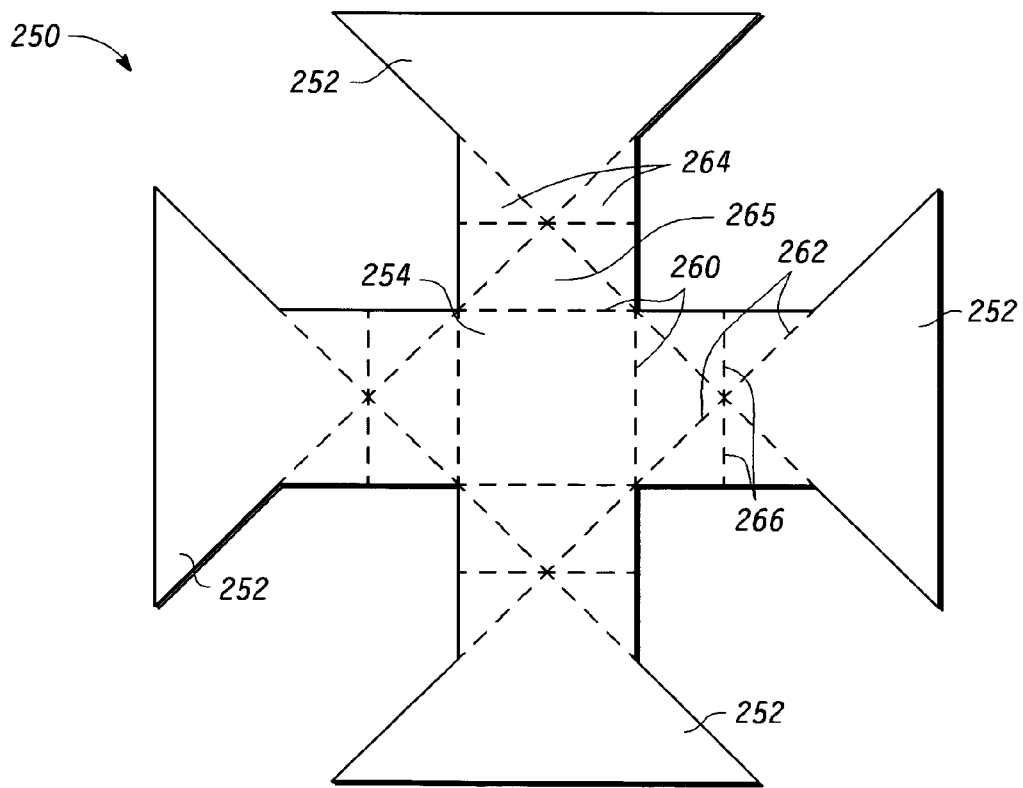
FIG. 15 is an illustration of a four-leaf, compressive interposer before it is folded.
Figure 16:
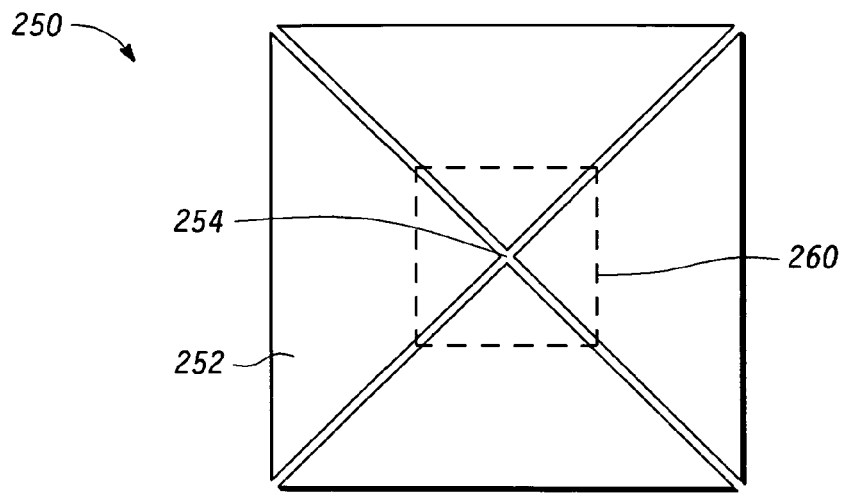
FIG. 16 is a top view illustration of the four-leaf, compressive interposer of FIG. 15, after it is folded.
Figure 17:
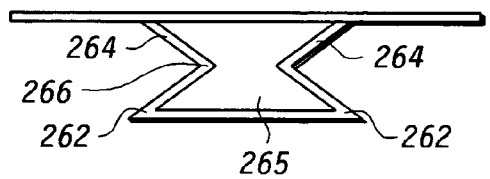
FIG. 17 is a side view illustration of the four-leaf, compressive interposer of FIG. 15, after it is folded.

FIGS. 15-17 illustrate an embodiment of a compressive interposer 250 which combines elements of an accordion-shaped, compressive section with a Z-shaped, compressive section. FIG. 15 illustrates the compressive interposer 250 before it is folded. FIG. 16 illustrates the compressive interposer 250 after it is folded. FIG. 17 illustrates the manner in which the compressive section is folded into an accordion-like shape. One advantage of this design over the design illustrated in FIGS. 9-10 is that there is less of a bottle neck in the compressive sections. Another advantage is that it creates more surface area in the top sections 252 to affix to a heat slug (not shown) or exposed outside the package (not shown) to affix to an external heat transfer device (not shown).

To fold the compressive interposer illustrated in FIG. 15, the top sections 252 are first folded up along bend 260. Then, the sides of compressive section 264 are folded back so that their centers fold along fold lines 266, while the compressive interposer is simultaneously folded along fold lines 262 to get an accordion-shape as illustrated in FIG. 17. The triangular shaped section 265 becomes the center of the Z-shape section of the design illustrated in FIG. 15.

Figure 18:
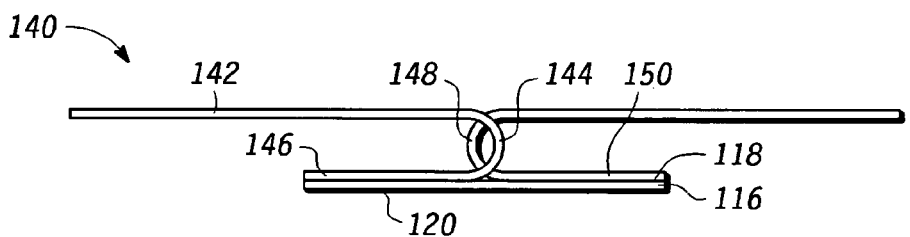
FIG. 18 is an illustration of an alternative embodiment of a compressive interposer.
Figure 19:
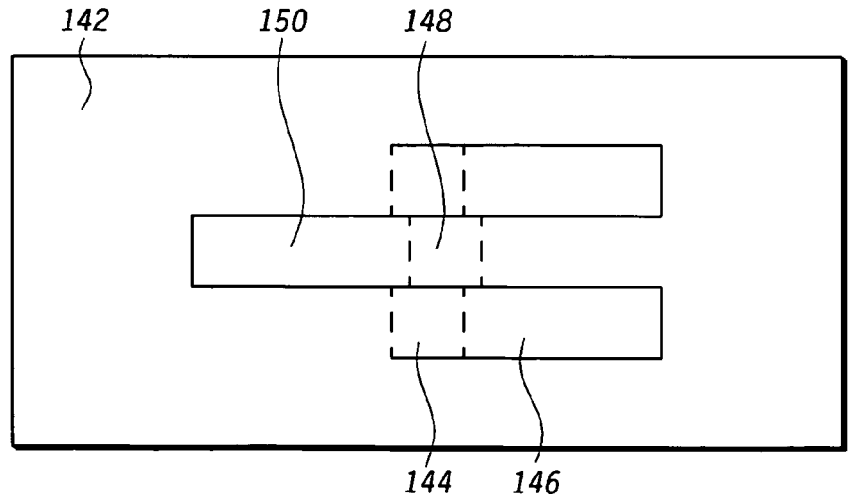
FIG. 19 is an illustration of the embodiment of the compressive interposer which is illustrated in FIG. 18, prior to shaping for assembly.

FIGS. 18-19 illustrate an alternative embodiment of the C-shaped spring interposers illustrated in FIGS. 12-13. In this embodiment, the interposers are formed from a series of interleaved springs with C-shaped compressive sections 144, 148. The IC 12 or non-compressive interposer is not completely covered by the compressive interposer leafs 146, 150. While only three leaves are shown and only two are labeled to simplify the illustration and description, respectively, other embodiments could have any number of leafs.

Figure 20:
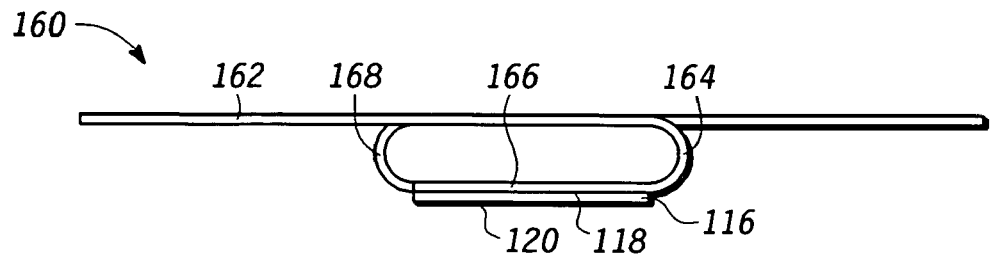
FIG. 20 is an illustration of an alternative embodiment of a compressive interposer.
Figure 21:
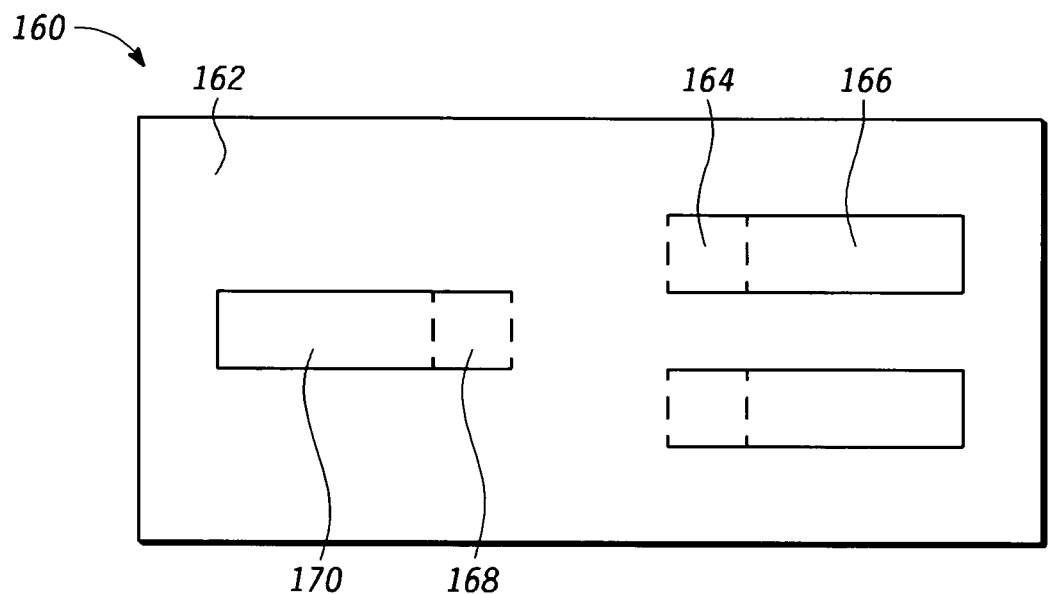
FIG. 21 is an illustration of the embodiment of the compressive interposer which is illustrated in FIG. 20, prior to shaping for assembly.

FIGS. 20-21 illustrate an alternative embodiment of the C-shaped spring leaf spacers illustrated in FIGS. 18-19. In this embodiment, the interposers are formed from a series of interleaved springs with C-shaped compressive sections 164, 168. In this embodiment, IC 12 or non-compressive interposer 116 is completely covered by the compressive interposer 162.

Figure 22:
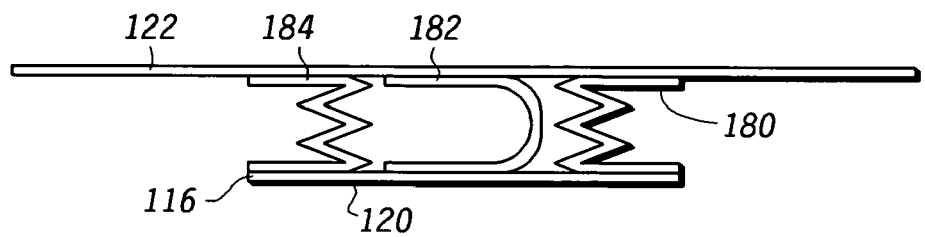
FIG. 22 is an illustration of a combination of different shaped compressive interposers.

FIG. 22 illustrates an alternative embodiment of an interposer comprising a series of compressive sections 180, 182, and 184. These interposers may be of the same type or configuration, or may be of different types or configurations. In FIG. 22, a C-Shaped compressive section 182 is sandwiched between two accordion-shaped compressive sections 180 and 184. In this case, the compressive sections are welded, spot welded, brazed, soldered or otherwise thermally attached to a heat slug or to an interposer top sheet 122 as shown in FIG. 22.

Figure 23:
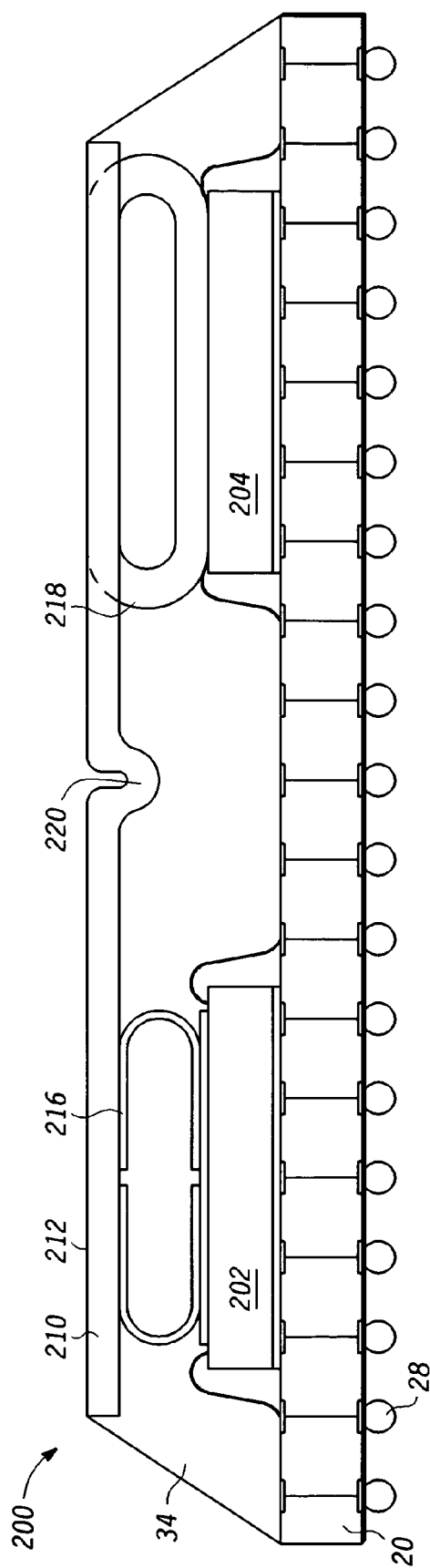
FIG. 23 is an illustration of a multi-chip IC package.

FIG. 23 is an illustration of a multi-chip IC package 200. In this package, the substrate can support multiple ICs. Two ICs 202 and 204 are depicted in FIG. 23, each with its own compressive interposer(s) 216 and 218. In the embodiment shown, the interposer 218 for one IC 204 is formed with a punch press to form the C-shape spring leaves. The interposer 216 for the other IC 202 is brazed/welded to an exposed top section 212 of the interposer 210. The individual compressive, thermally conductive interposer can be made or assembled together with a stress release feature 220 as shown in FIG. 23.

Figure 24:
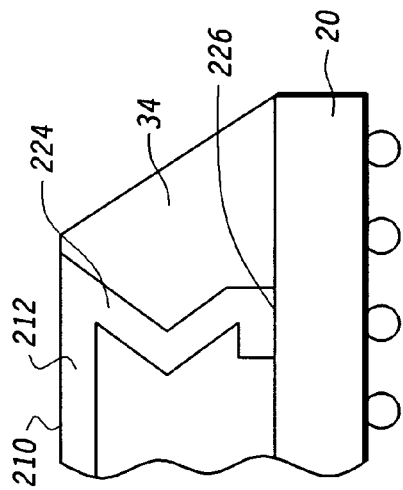
FIG. 24 is an illustration of a compressive standoff for supporting a compressive interposer over the substrate.

FIG. 24 illustrates a feature that can be included in any of the compressive interposer embodiments described above. Specifically, it illustrates a compressive section 224 between the top section 212 and of the compressive interposer 210 and a mount section 226 which rests on the substrate 20. These features may be used for extra support or to help register the location of the compressive interposer within the package during manufacture. These features may also be combined with any of the other embodiments described herein, including embodiments 52, 71, 100, 130, 250, 140, 160, 122, or any other embodiments not specifically described herein.

Although a focus is made on shaped compressive interposers, other forms of shaped and unshaped compressive interposers are also contemplated as being within the scope and spirit of the disclosure.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. An integrated circuit package, comprising:
   a substrate;
   an integrated circuit mounted on said substrate;
   a first an essentially z-shaped, compressive, thermally conductive interposer mounted on said integrated circuit;
   a heat spreader mounted on said first interposer, and
   a molding compound disposed between said heat spreader and said substrate.

2. The integrated circuit package of claim 1, wherein said package comprises thermally conductive material in the form of shaped sheets.

3. The integrated circuit package of claim 1, wherein said package comprises a metal or metal alloy.

4. The integrated circuit package of claim 1, wherein said package comprises a non-compressive, thermally conductive section attached to a compressive section.

5. The integrated circuit package of claim 4, further comprising a second non-compressive, thermally conductive interposer attached to a side of said thermally conductive, deformable interposer.

6. The integrated circuit package of claim 1, wherein one side of the first interposer is exposed to the outside of said integrated circuit package.

7. The integrated circuit package of claim 6, wherein said integrated circuit has an active side and a non-active side, wherein said active side faces the substrate, and wherein said non-active side faces the first interposer.

8. The integrated circuit package of claim 7, wherein said first interposer is mounted to the non-active side of the integrated circuit by means of a thermally conductive adhesive.

9. The integrated circuit package of claim 7, wherein said first interposer is mounted to the non-active side of the integrated circuit by means of a thermally conductive paste.

10. The integrated circuit package of claim 6, wherein said integrated circuit has an active side and a non-active side, wherein said non-active side is facing the substrate, and wherein the active side faces the first interposer.

11. The integrated circuit package of claim 10 wherein said first interposer is mounted to the active side of the integrated circuit by means of a thermally conductive adhesive.

12. The integrated circuit package of claim 10, wherein said thermally conductive adhesive is not electrically conductive.

13. The integrated circuit package of claim 12, wherein said thermally conductive, non-electrically conductive adhesive is in the form of a tape adhesive.

14. The integrated circuit package of claim 5, wherein said integrated circuit has an active side and a non-active side, and wherein said second interposer is sandwiched between the first interposer and the active side of the integrated circuit.

15. The integrated circuit package of claim 14, wherein said second interposer is affixed to the active side of the integrated circuit with a thermally conductive, non-electrically conductive adhesive, and wherein said second interposer is affixed to the compressive interposer with thermally conductive adhesive.

16. An integrated circuit package, comprising:
a substrate;
an integrated circuit attached to said substrate; and
a an essentially z-shaped, compressive, thermally conductive interposer which is mounted on said integrated circuit, and which comprises a non-compressive, thermally conductive layer;
wherein said non-compressive, thermally conductive layer has at least one surface exposed to the outside of the integrated circuit package.

17. The integrated circuit package of claim 16, wherein said integrated circuit has an active side and a non-active side, wherein said active side faces the substrate, and wherein said non-active side faces the compressive, thermally conductive interposer.

18. The integrated circuit package of claim 17, wherein said compressive, thermally conductive interposer is mounted to the non-active side of the integrated circuit by means of a thermally conductive adhesive.

19. The integrated circuit package of claim 17, wherein said compressive, thermally conductive interposer is mounted to the non-active side of the integrated circuit by means of a thermally conductive paste.

20. The integrated circuit package of claim 16, wherein said integrated circuit has an active side and a non-active side, wherein the non-active side faces the substrate, and wherein the active side faces the compressive, thermally conductive interposer.

21. The integrated circuit package of claim 20, wherein said compressive, thermally conductive interposer is mounted to the active side of the integrated circuit by means of a thermally conductive adhesive.

22. The integrated circuit package of claim 21, wherein said thermally conductive adhesive is not electrically conductive.

23. The integrated circuit package of claim 17, wherein said thermally conductive, non-electrically conductive adhesive is present as an adhesive tape.

24. The integrated circuit package of claim 20, wherein said thermally conductive, non-compressive interposer layer is sandwiched between the compressive, thermally conductive interposer and the active side of the integrated circuit.

25. The integrated circuit package of claim 24, wherein said non-compressive interposer layer is affixed to the active side of the integrated circuit with thermally conductive, non-electrically conductive adhesive, and wherein said non-compressive interposer layer is affixed to the compressive interposer with thermally conductive adhesive.

26. An integrated circuit package, comprising:
an integrated circuit which generates heat;
a heat spreader;
a first, non-compressive interposer disposed between said integrated circuit and said heat spreader; and
a second an essentially z-shaped, compressive, thermally conductive interposer disposed between said heat spreader and said first interposer;
wherein said compressive, thermally conductive interposer forms a thermally conductive path between the integrated circuit and an exterior surface of the package.

27. The integrated circuit package of claim 26, further comprising a molding compound disposed between said heat spreader and said first interposer.

* * * * *